US012635086B2

(12) United States Patent　(10) Patent No.:　US 12,635,086 B2
Huang　(45) Date of Patent:　May 19, 2026

(54) DISPLAY DEVICE EQUIPPED WITH FLEXIBLE SCREEN

(71) Applicant: AUO Corporation, Hsinchu (TW)

(72) Inventor: Yu-Chun Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 279 days.

(21) Appl. No.: 18/391,608

(22) Filed: Dec. 20, 2023

(65) Prior Publication Data

US 2025/0142742 A1　May 1, 2025

(30) Foreign Application Priority Data

Oct. 27, 2023　(TW) ................................. 112141384

(51) Int. Cl.
　　*H05K 5/02*　　(2006.01)
　　*G06F 1/16*　　(2006.01)
(52) U.S. Cl.
　　CPC ......... *H05K 5/0217* (2013.01); *G06F 1/1652* (2013.01)
(58) Field of Classification Search
　　CPC ...... H05K 5/0217; G09F 9/301; G06F 1/1652
　　See application file for complete search history.

(56) References Cited

U.S. PATENT DOCUMENTS 11,655,182 B2　5/2023　Black et al.
2018/0198899 A1*　7/2018　Lee ....................... G06F 1/1652

2020/0060028 A1　2/2020　Kim et al.
2021/0201713 A1*　7/2021　Chung .................... G09F 9/301
2021/0212211 A1*　7/2021　Tang ...................... G09F 9/301
2022/0141976 A1　5/2022　Yang et al.
2023/0016622 A1*　1/2023　Gudivada ............. G06F 1/1624
2023/0140447 A1　5/2023　Pyo
2023/0217609 A1*　7/2023　Lee ......................... G09F 9/301
　　　　　　　　　　　　　　　　361/807
2023/0225064 A1*　7/2023　Kim ..................... H05K 5/0217
　　　　　　　　　　　　　　　　361/807

FOREIGN PATENT DOCUMENTS

CN　　108422943　　8/2018
CN　　113643611　　11/2021
CN　　216128215　　3/2022
CN　　216184856　　4/2022

* cited by examiner

*Primary Examiner* — Sagar Shrestha
(74) *Attorney, Agent, or Firm* — JCIPRNET

(57)　　　　　　ABSTRACT

A display device includes a base, a pivot assembly, a roller, a flexible screen, and an appearance member. The pivot assembly is arranged on the base. Two opposite ends of the roller are pivotally connected to the pivot assembly. The flexible screen has opposite first and second edges, the first edge is connected to the roller, and the roller is adapted to unfold or roll up the flexible screen. The appearance member has an opening having opposite first and second sides, the appearance member covers the base, and the base corresponds to the first side of the opening. In a folded state, the flexible screen is located outside the opening. During a transition from the folded state to an unfolded state, the second edge moves towards the second side of the opening to expose at least one portion of the flexible screen to the opening.

15 Claims, 20 Drawing Sheets

DISPLAY DEVICE EQUIPPED WITH FLEXIBLE SCREEN

CROSS-REFERENCE TO RELATED APPLICATION

This application claims the priority benefit of Taiwan application serial no. 112141384, filed on Oct. 27, 2023. The entirety of the above-mentioned patent application is hereby incorporated by reference herein and made a part of this specification.

BACKGROUND

Technical Field

The disclosure relates to a display device and particularly relates to a display device equipped with a flexible screen.

Description of Related Art

With the advancements in the automotive industry and technology, the demand for in-car audio and video entertainment has experienced continual growth. For instance, the incorporation of a display device positioned behind the front seats has emerged to enhance the entertainment experience for rear passengers.

However, during instances of abrupt braking or collisions, the rear passengers, influenced by inertia, may propel forward, posing a risk of impact with a screen of the display device. The strong impact may result in screen breakage, and the resultant shattered glass fragments may cause cuts to the passengers.

SUMMARY

The disclosure provides a display device of which a flexible screen has a storage function.

In an embodiment of the disclosure, a display device including a base, a pivot assembly, a roller, a flexible screen, and an appearance member is provided. The pivot assembly is arranged on the base. The roller has two opposite ends pivotally connected to the pivot assembly. The flexible screen has a first edge and a second edge opposite to each other, where the first edge is connected to the roller, and the roller is adapted to unfold or roll up the flexible screen. The appearance member has an opening, the opening has a first side and a second side opposite to each other, the appearance member covers the base, and the base corresponds to the first side. In a folded state, the flexible screen is located outside the opening. During a transition from the folded state to an unfolded state, the second edge moves towards the second side of the opening to expose at least one portion of the flexible screen to the opening.

According to an embodiment of the disclosure, the display device further includes a driving member arranged in the roller and adapted to drive the roller to rotate relative to the base.

According to an embodiment of the disclosure, the roller includes a first shell and a second shell, a connection point where the first shell is assembled to the second shell has a notch, and the first edge of the flexible screen corresponds to the notch.

According to an embodiment of the disclosure, the display device further includes a circuit board, where one end of the circuit board is connected to the first edge, and the circuit board extends into the roller through the notch to be adhered to an inner surface of the second shell.

According to an embodiment of the disclosure, the display device further includes a support member located below the appearance member and corresponding to the opening. In the unfolded state, the flexible screen covers the support member, and the support member is configured to press the flexible screen against a periphery of the appearance member corresponding to the opening.

According to an embodiment of the disclosure, the display device further includes an auxiliary structure that includes a plurality of first rotation members and a plurality of second rotation members. The opening has a third side and a fourth side opposite to each other, the first rotation members are arranged on two opposite sides of the support member, the second rotation members are arranged on two opposite sidewalls of the appearance member, the flexible screen has a third edge and a fourth edge opposite to each other, the flexible screen is adapted to pass through the auxiliary structure, and the third edge and the fourth edge are located between the first rotation members and the second rotation members.

According to an embodiment of the disclosure, in a normal direction of the support member, the first rotation members and the second rotation members are staggered or aligned with each other.

According to an embodiment of the disclosure, the display device further includes a plurality of rolling members arranged on the first side of the opening. During the transition between the folded state and the unfolded state, the second edge of the flexible screen is adapted to pass through and contact the rolling members.

According to an embodiment of the disclosure, the pivot assembly includes a first bracket and a second bracket, and the two opposite ends of the roller are pivotally connected to the first bracket and the second bracket, respectively.

According to an embodiment of the disclosure, the display device further includes two limiting stands arranged on the base and located between the first bracket and the second bracket. Each of the two limiting stands includes a plurality of rolling wheels, the flexible screen has a third edge and a fourth edge opposite to each other, and while the roller is unfolding or rolling up the flexible screen, the third edge and the fourth edge of the flexible screen contact the rolling wheels.

According to an embodiment of the disclosure, the display device further includes an optical sensor module arranged on the first bracket.

According to an embodiment of the disclosure, the display device further includes a support component that includes two chains and a plurality of support plates. The flexible screen has a third edge and a fourth edge opposite to each other, the two chains are respectively fixed to the third edge and the fourth edge, each of the chains has an end portion corresponding to the first edge, the end portion is fixed to the roller, two opposite ends of each of the support plates are connected to the two chains, and the support plates are located below the flexible screen.

According to an embodiment of the disclosure, the display device further includes a plurality of limiting structures arranged on the base. Each of the limiting structures has a groove, each of the chains includes a plurality of roller balls corresponding to the third edge and the fourth edge, respectively, and during the transition from the folded state to the unfolded state, the roller balls are adapted to contact the grooves respectively corresponding to the roller balls.

According to an embodiment of the disclosure, the display device further includes two magnetic members corresponding to the two chains. The two magnetic members are adapted to magnetically attract the two chains to drive the support plates to move and further drive the second edge of the flexible screen to move towards the second side of the opening.

Considering the above, in the display device provided in one or more embodiments of the disclosure, the roller is adapted to unfold or roll up the flexible screen. During instances of abrupt braking or collisions of vehicles, the flexible screen may be changed to the folded state, allowing the flexible screen to be stored behind the appearance member, so as to avoid passengers from hitting the flexible screen and accordingly prevent the resultant shattered glass fragments from causing cuts to the passengers.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
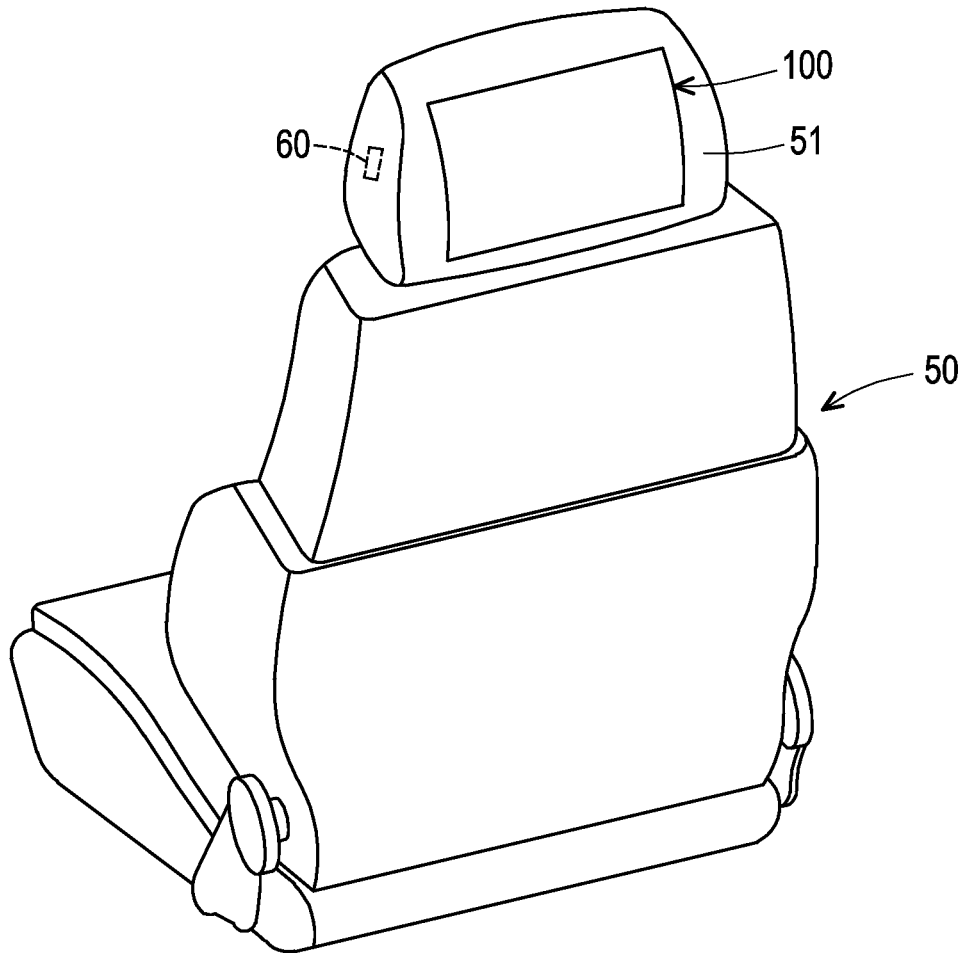
FIG. 1 is a schematic view illustrating a display device is applied to a seat according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like parts.

In the accompanying drawings, the thickness of layers, films, panels, regions, and so forth are enlarged for clarity. The same reference numbers refer to the same elements throughout the specification. It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" or "coupled" may refer to the presence of other elements between the two elements.

Besides, relative terminologies, such as "lower" or "bottom" and "upper" or "top" may be used herein to describe the relationship between one element and another element, as shown in the drawings. It should be understood that relative terminologies are intended to encompass different orientations of the device in addition to the orientation shown in the drawings. For instance, if a device in one of the accompanying drawings is turned upside down, elements described as being on the "lower" side of other elements would then be oriented on the "upper" sides of the other elements. Thus, the exemplary terminology "lower" may include an orientation of being on the "lower" side and the "upper" side, depending on the particular orientation of the accompanying drawings. Similarly, if the device in one of the accompanying drawings is turned upside down, elements described as being "below" or "beneath" other elements would then be oriented "above" the other elements. Thus, the exemplary terminology "below" or "beneath" may encompass an orientation of being above and below.

Considering the particular amount of measurement and measurement-related errors discussed (i.e., the limitations of the measurement system), the terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±10%, or ±5%. Furthermore, the terminology "about," "approximately," or "substantially" as used herein may be chosen from a range of acceptable deviations or standard deviations depending on the optical properties, etching properties, or other properties, rather than one standard deviation for all properties.

Cross-sectional diagrams as schematic representations of preferred embodiments in the disclosure are employed to illustrate exemplary embodiments. Consequently, it is to be understood that variations in the depicted shapes may arise due to factors such as manufacturing techniques and tolerances. The embodiments provided in the disclosure should not be construed as being restricted to the specific configurations illustrated in this disclosure, but should encompass, for instance, deviations in shape resulting from the manufacturing processes. For instance, regions depicted or described as being flat may exhibit rough and/or nonlinear features, and acute angles presented may be rounded. Accordingly, the depictions of regions in the drawings are fundamentally schematic, and their shapes are not intended to precisely represent the actual contours of the regions, nor are they intended to impose limitations on the scope of the claims.

Unless otherwise defined, all terminologies (including technical and scientific terminologies) used herein have the same meaning as commonly understood by people having ordinary skill in the art to which the disclosure belongs. It is understood that these terminologies, such as those defined in commonly used dictionaries, should be interpreted as having meanings consistent with the relevant art and the background or context of the disclosure, and should not be interpreted in an idealized or overly formal way, unless otherwise defined in the disclosure.

FIG. 1 is a schematic view illustrating a display device is applied to a seat according to an embodiment of the disclosure. With reference to FIG. 1, the display device 100 provided in this embodiment is suitable for be applied to a front row seat 50 of a vehicle, which should however not be construed as a limitation. In this embodiment, the display device 100 is installed on a headrest 51 of the seat 50, and passengers in the back row may use the display device 100 for audio and video entertainment. It should be noted that the location of the display device 100 is schematically drawn in the figure, and the size, the contour shape, and other proportional relationships of the display device 100 are merely illustrative and should not be construed as limitations.

Figure 2:
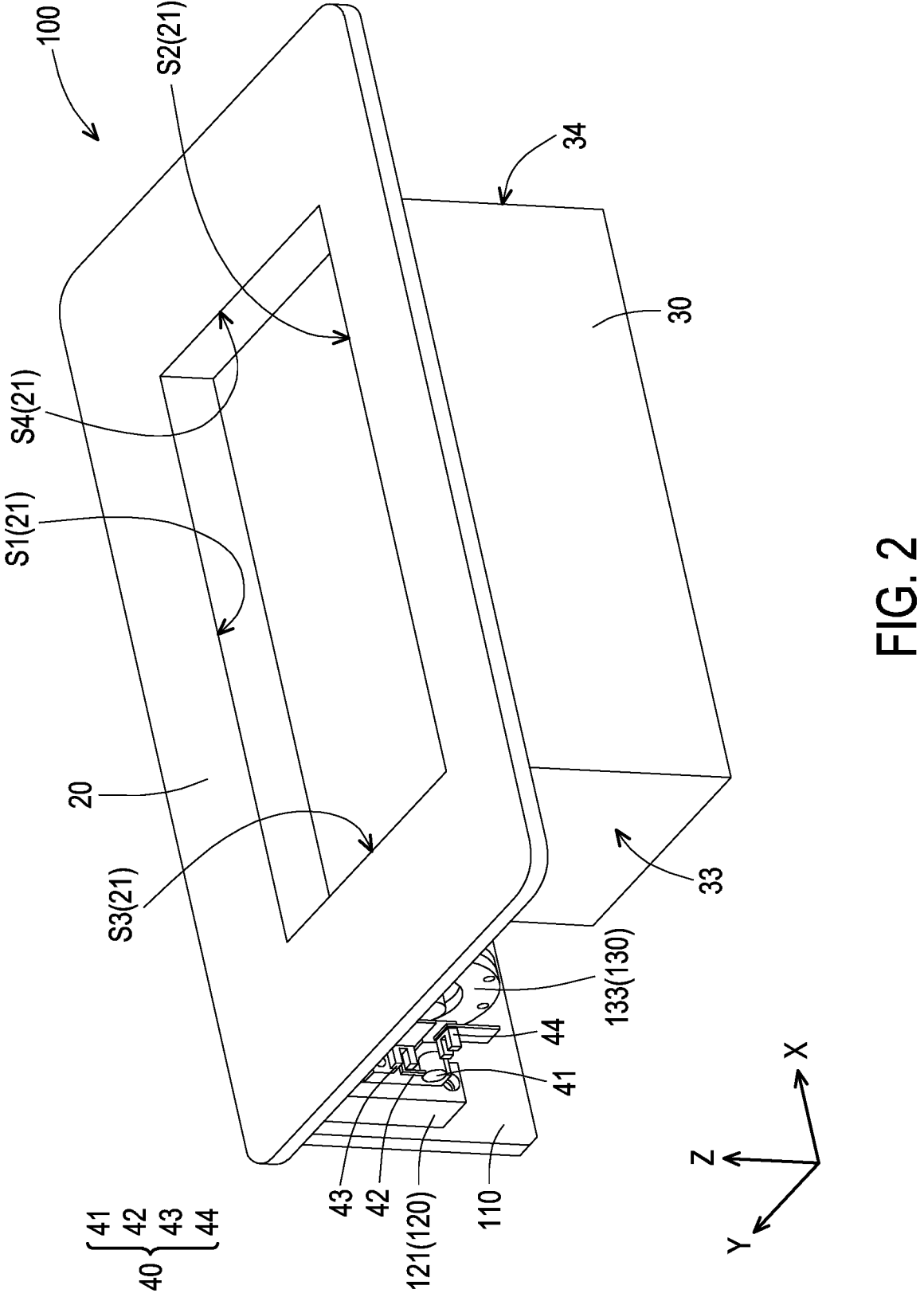
FIG. 2 is a schematic view of a display device according to an embodiment of the disclosure.
Figure 3:
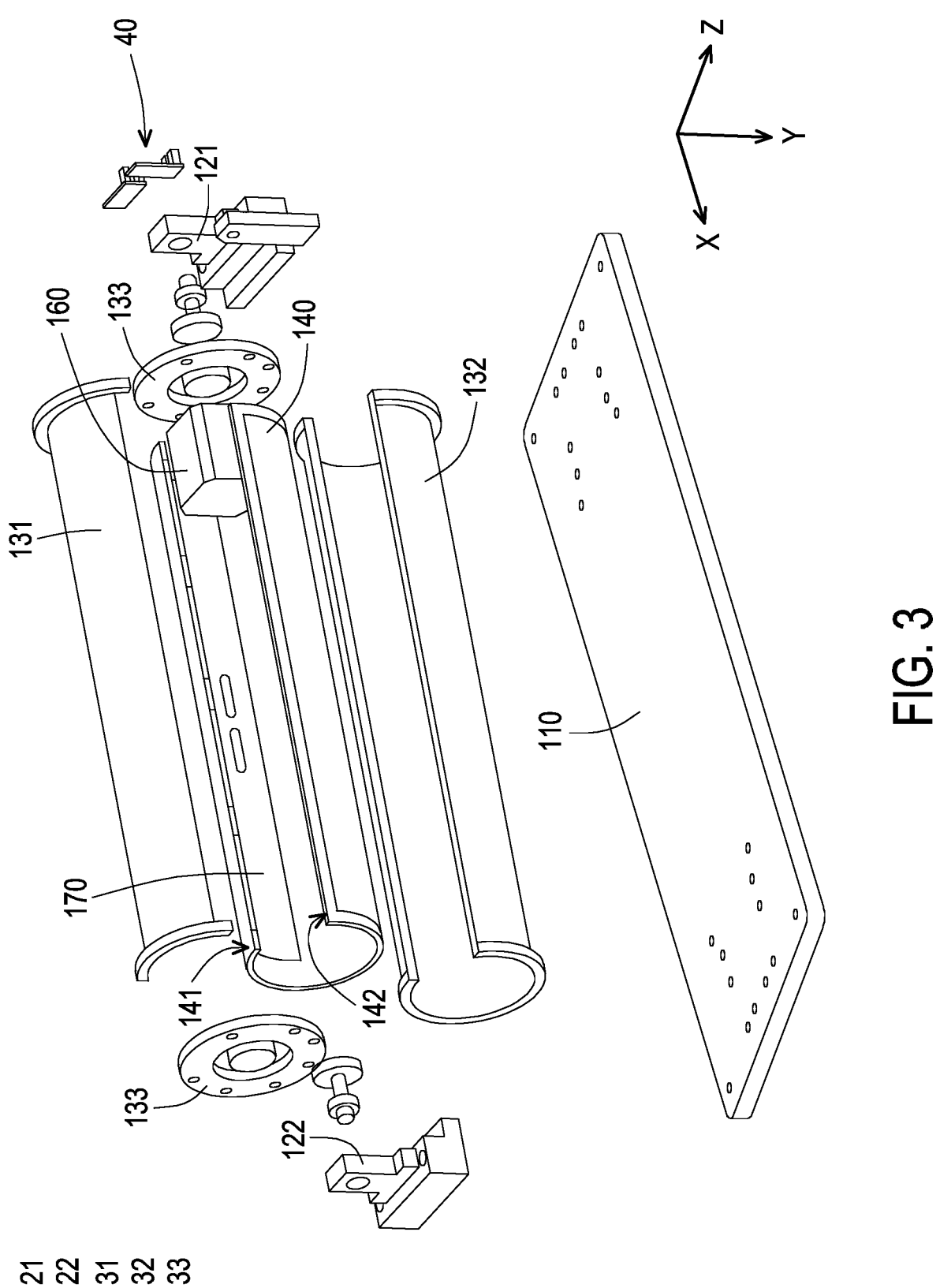
FIG. 3 is a schematic exploded view of the display device in FIG. 2.
Figure 4A:
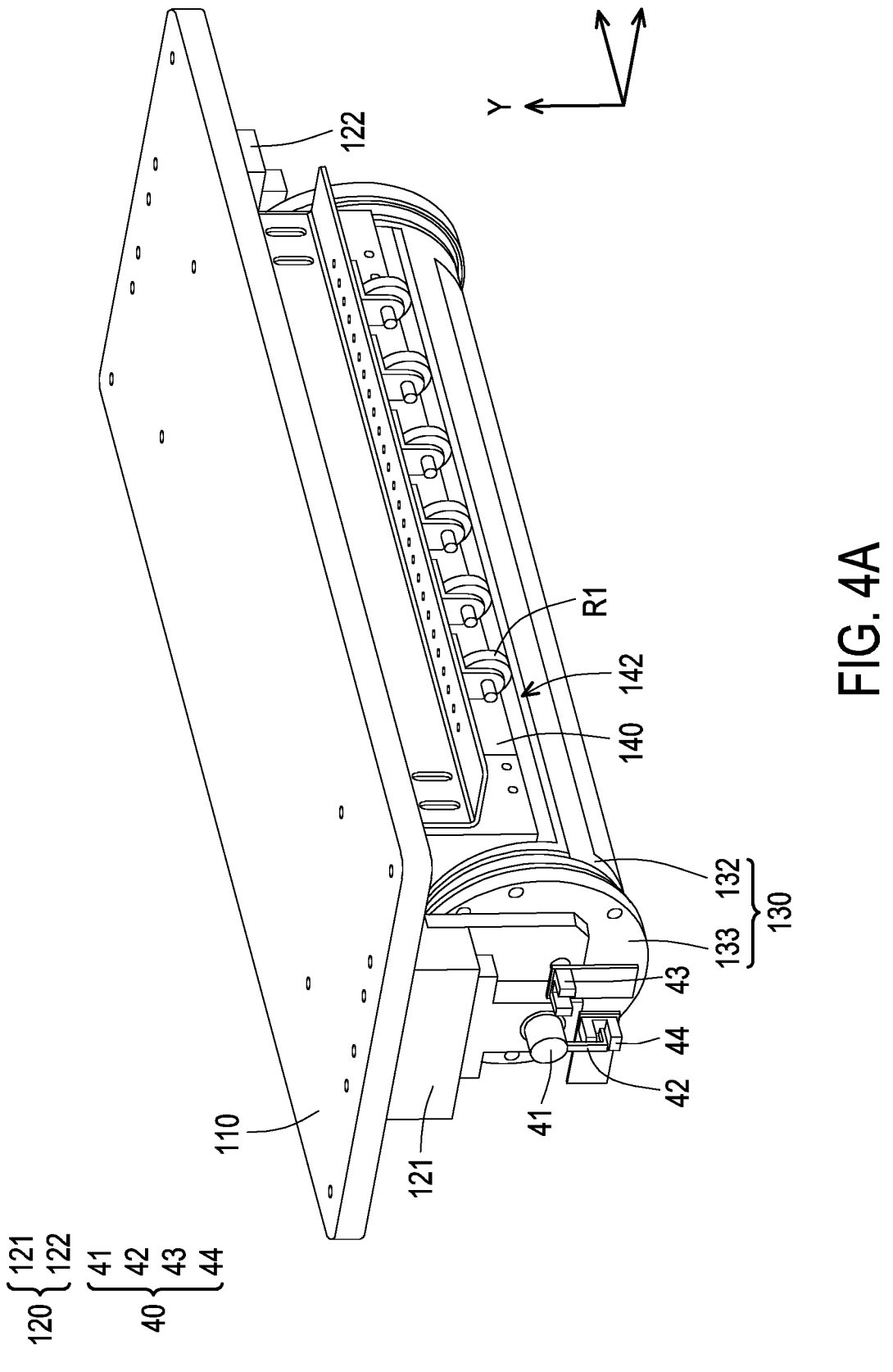
FIG. 4A and FIG. 4B are schematic views illustrating operations of the display device in FIG. 2.
Figure 4B:
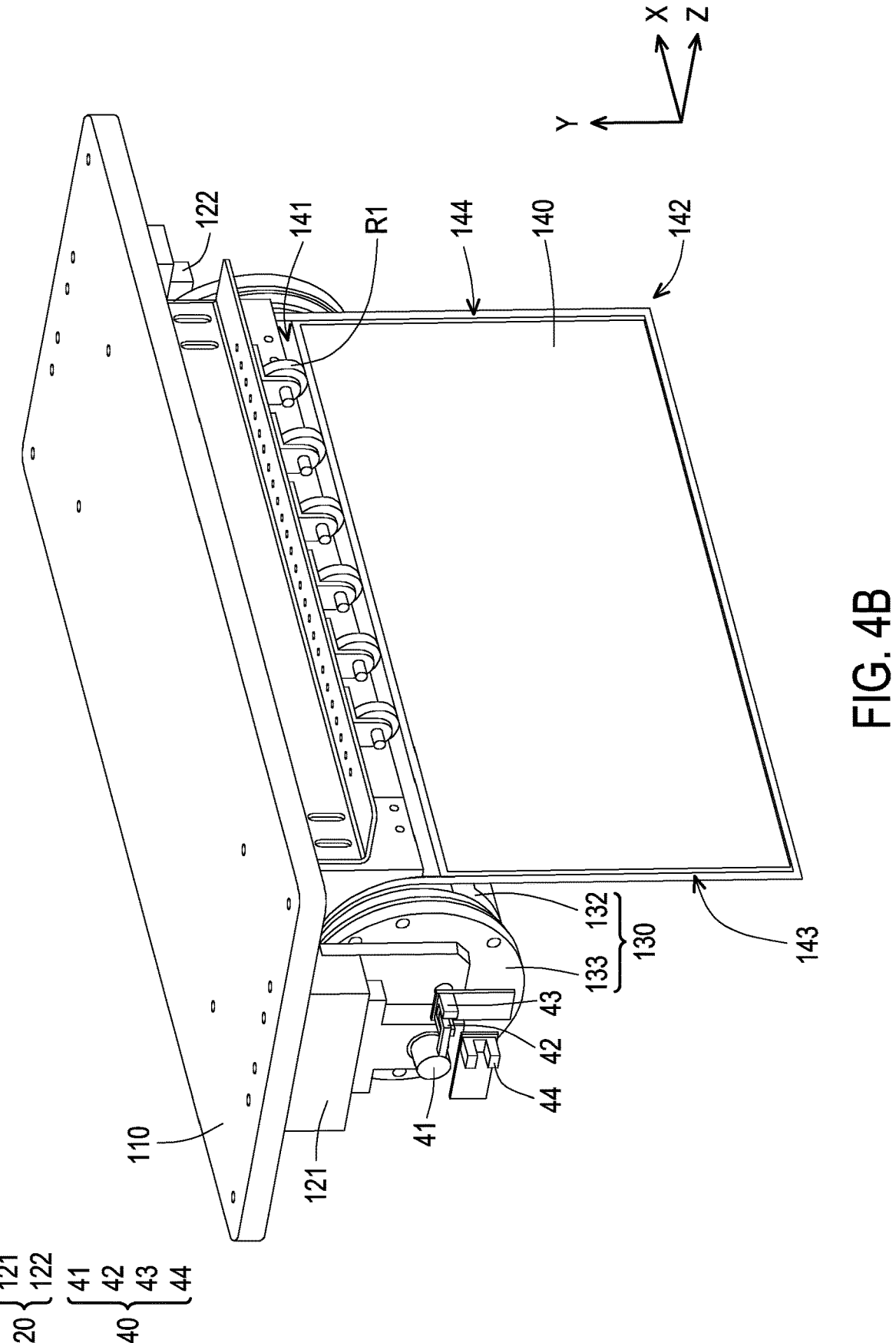

FIG. 2 is a schematic view of a display device according to an embodiment of the disclosure. FIG. 3 is a schematic exploded view of the display device in FIG. 2. FIG. 4A and FIG. 4B are schematic views illustrating operations of the display device in FIG. 2. A Cartesian coordinate system X-Y-Z is provided here for the convenience of subsequent descriptions and references to components. Note that the illustration of limiting stands is omitted in FIG. 3, and the illustration of the appearance member is omitted in FIG. 4A to FIG. 4C for the sake of clarity.

With reference to FIG. 2 and FIG. 3, in this embodiment, the display device 100 includes a base 110, a pivot assembly 120, a roller 130, a flexible screen 140, and an appearance member 20. Here, the flexible screen 140 is an organic light emitting diode (OLED) display or a micro LED display, which should however not be construed as a limitation. In an embodiment of the disclosure, the flexible screen 140 includes an ultra-thin glass (UTG) cover, an optical clear adhesive (OCA), a panel, a pressure sensitive adhesive (PSA), a hollow base plate, and other components, which should however not be construed as a limitation.

In this embodiment, the appearance member 20 has an opening 21, the opening 21 has a first side S1 and a second side S2 that are opposite to each other, the appearance member 20 covers the base 110, and the base 110 corresponds to the first side S1.

In this embodiment, the size, the contour shape, and the proportion of the appearance member 20 are illustrative and should not be construed as limitations in the disclosure. Specifically, the appearance member 20 includes but is not limited to an elastic material, such as foam, rubber, and so on. In an embodiment of the disclosure, the appearance member 20 is covered by the headrest 51 in FIG. 1, so that the display device 100 is located inside the headrest 51. Alternatively, the appearance member 20 is a part of the headrest 51 in FIG. 1, and the flexible screen 140 is exposed by the opening 21, which should however not be construed as a limitation in the disclosure.

In this embodiment, the pivot assembly 120 is arranged on the base 110, and two opposite ends of the roller 130 are pivotally connected to the pivot assembly 120. Specifically, the pivot assembly 120 includes a first bracket 121 and a second bracket 122, and the two opposite ends of the roller 130 are respectively pivotally connected to the first bracket 121 and the second bracket 122.

In this embodiment, the flexible screen 140 has a first edge 141 and a second edge 142 opposite to each other. The first edge 141 is connected to the roller 130, and the roller 130 is adapted to unfold or roll up the flexible screen 140. The first edge 141 is connected to the roller 130 through adhesion, which should however not be construed as a limitation in the disclosure.

In a folded state shown in FIG. 4A, the flexible screen 140 is located outside the opening 21 of the appearance member 20 in FIG. 2. During a transition from the folded state shown in FIG. 4A to an unfolded state shown in FIG. 4B, the second edge 142 moves towards the second side S2 of the opening 21 to expose at least one portion of the flexible screen 140 to the opening 21 for the user to watch.

Under the above configuration, the size of a display frame on the flexible screen 140 may be adjusted according to a usage scenario, which contributes to reduction of power consumption. In addition, during instances of abrupt braking or collisions of vehicles, the flexible screen 140 may be immediately and automatically changed to the folded state, allowing the flexible screen 140 to be stored behind the appearance member 20, so as to avoid passengers from hitting the flexible screen and accordingly prevent the resultant shattered glass fragments from causing cuts to the passengers.

In detail, the display device 100 further includes a sensor 60 (FIG. 1) and a control module. The sensor 60, for instance, is an accelerometer or a gravity sensor, which should however not be construed as a limitation. The sensor 60 may be arranged in the seat 50 or in the interior of the vehicle, which should however not be construed as a limitation. The control module is coupled to the driving member 160 and the sensor 60 and is configured to drive the driving member 160 to rotate the roller 130 and roll up the flexible screen 140 into a folded state based on a sensing signal from the sensor 60. That is, when the sensor 60 detects an instantaneous acceleration exceeding a predetermined threshold, the flexible screen 140 is equipped with an immediate retraction function to avoid passengers from coming into contact with the flexible screen 140, thereby preventing unexpected glass fracture or fragments from causing cuts to the passengers. In accordance with the regulatory framework established by the National Highway Traffic Safety Administration (NHTSA), it is mandated that the airbag be deployed if the vehicle's speed experiences an instantaneous reduction of 23 km/h. Therefore, the predetermined threshold may be determined with reference to the airbag regulations or safety considerations, and the immediate retraction function is activated at half of the numerical value derived from the specified regulations or safety criteria, which should however not be construed as a limitation in the disclosure.

With reference to FIG. 3, in this embodiment, the roller 130 includes a first shell 131, a second shell 132, and two side covers 133. The first shell 131 is assembled to the second shell 132, and the two side covers 133 are respectively assembled to two sides of the first shell 131 and the second shell 132 to form an accommodation space. The display device 100 further includes a driving member 160 arranged in the accommodation space of the roller 130. The driving member 160 is adapted for driving the roller 130 to rotate relative to the base 110. The driving member 160 is, for instance, a motor, which should however not be construed as a limitation in the disclosure.

Figure 4C:
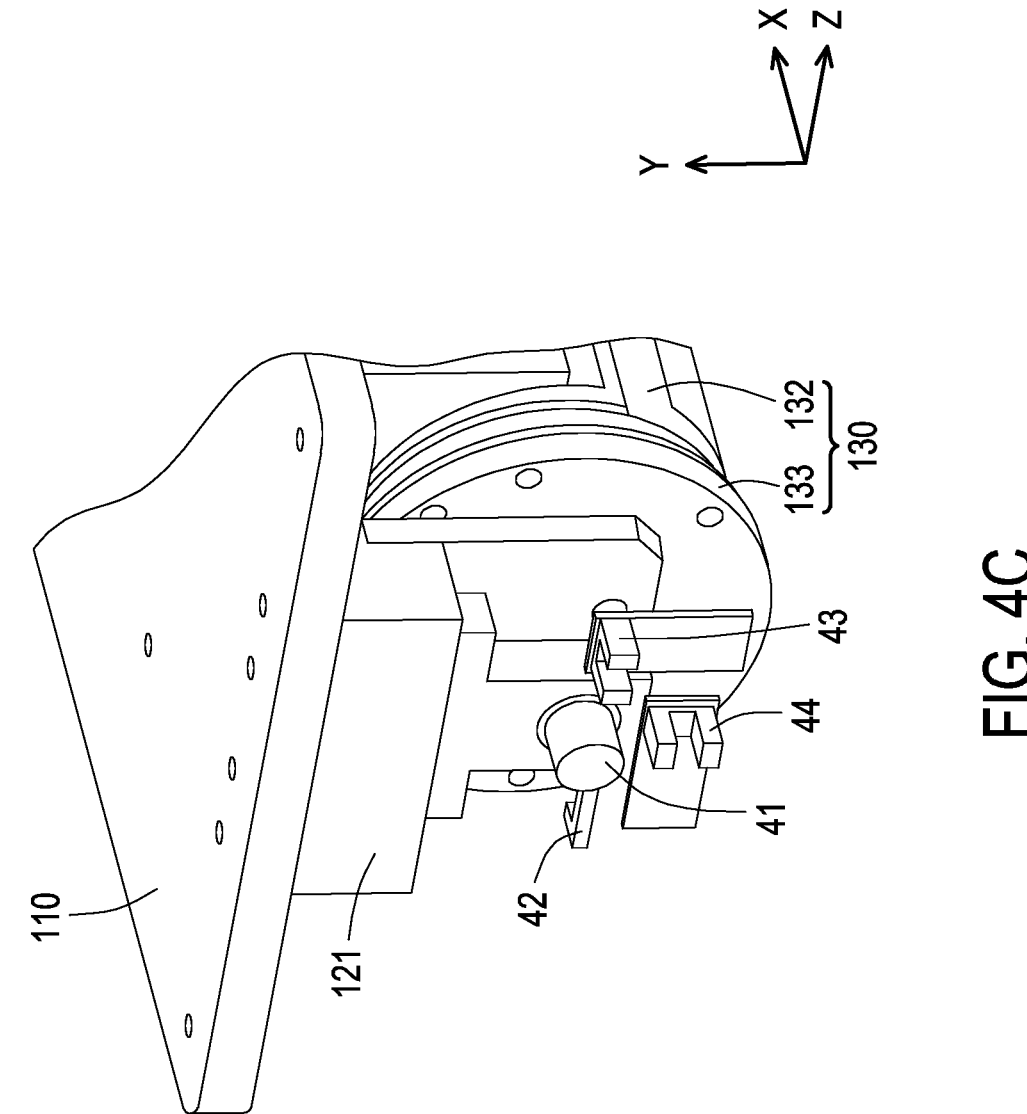
FIG. 4C is a schematic partial view of the display device in FIG. 2 during operation.

In an embodiment, the display device 100 further includes an optical sensor module 40 arranged on the first bracket 121. Specifically, the optical sensor module 40 includes a rotation shaft 41, a moving member 42, a first light blocker 44, and a second light blocker 43. The first light blocker 44 and the second light blocker 43 are fixed to the pivot assembly 120 and do not rotate with the roller 130. The moving member 42 is connected to the rotation shaft 41 which is adapted to rotate with the roller 130. In the folded state shown in FIG. 4A, the moving member 42 is located at the first light blocker 44. During the transition from the folded state shown in FIG. 4A to the unfolded state shown in FIG. 4B, the moving member 42 begins to move, as shown in FIG. 4C, until the moving member 42 moves to the second light blocker 43, as shown in FIG. 4B. The advantage of such design is that the unfolding or rolling up operation performed on the flexible screen 140 may be accurately controlled. In another embodiment, unfolding and rolling up the flexible screen 140 may also be controlled by software programs, which should however not be construed as a limitation in the disclosure.

Figure 5:
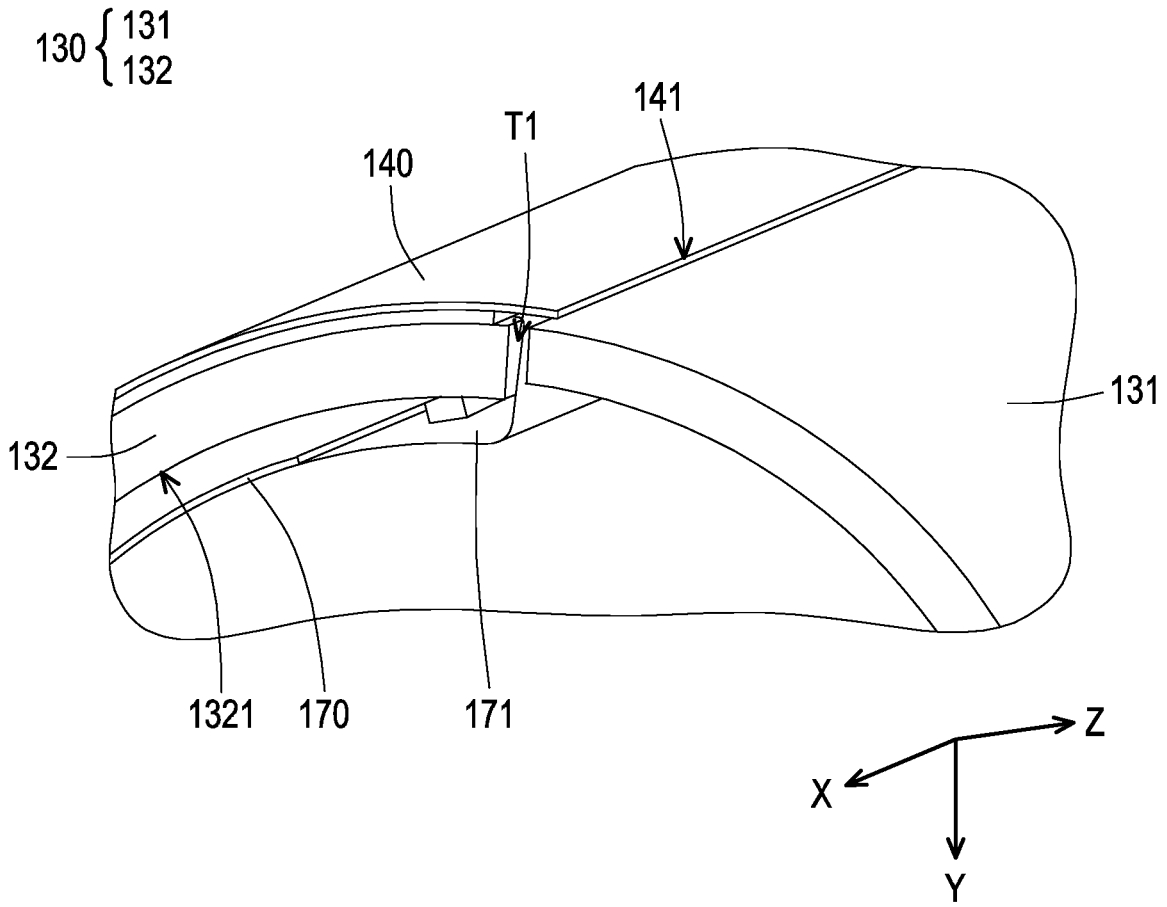
FIG. 5 is a schematic partial view of the display device in FIG. 2.

FIG. 5 is a schematic partial view of the display device in FIG. 2. With reference to FIG. 3 and FIG. 5, in this embodiment, a connection point where the first shell 131 is assembled to the second shell 132 has a notch T1, and the notch T1 extends in an axial direction (e.g., an X direction) of the roller 130. The first edge 141 of the flexible screen 140 corresponds to the notch T1.

In this embodiment, the display device 100 further includes a circuit board 170, one end of the circuit board 170 is connected to the first edge 141, and the circuit board 170 extends into the roller 130 through the notch T1 to be attached to an inner surface 1321 of the second shell 132. Here, the method of attachment refers to adhesion, which should however not be construed as a limitation in the disclosure. The circuit board 170 may further include a driving chip 171, and the driving chip 171 may be configured to provide electrical signals required by a display medium on the flexible screen 140, which should however not be construed as a limitation in the disclosure.

Figure 6A:
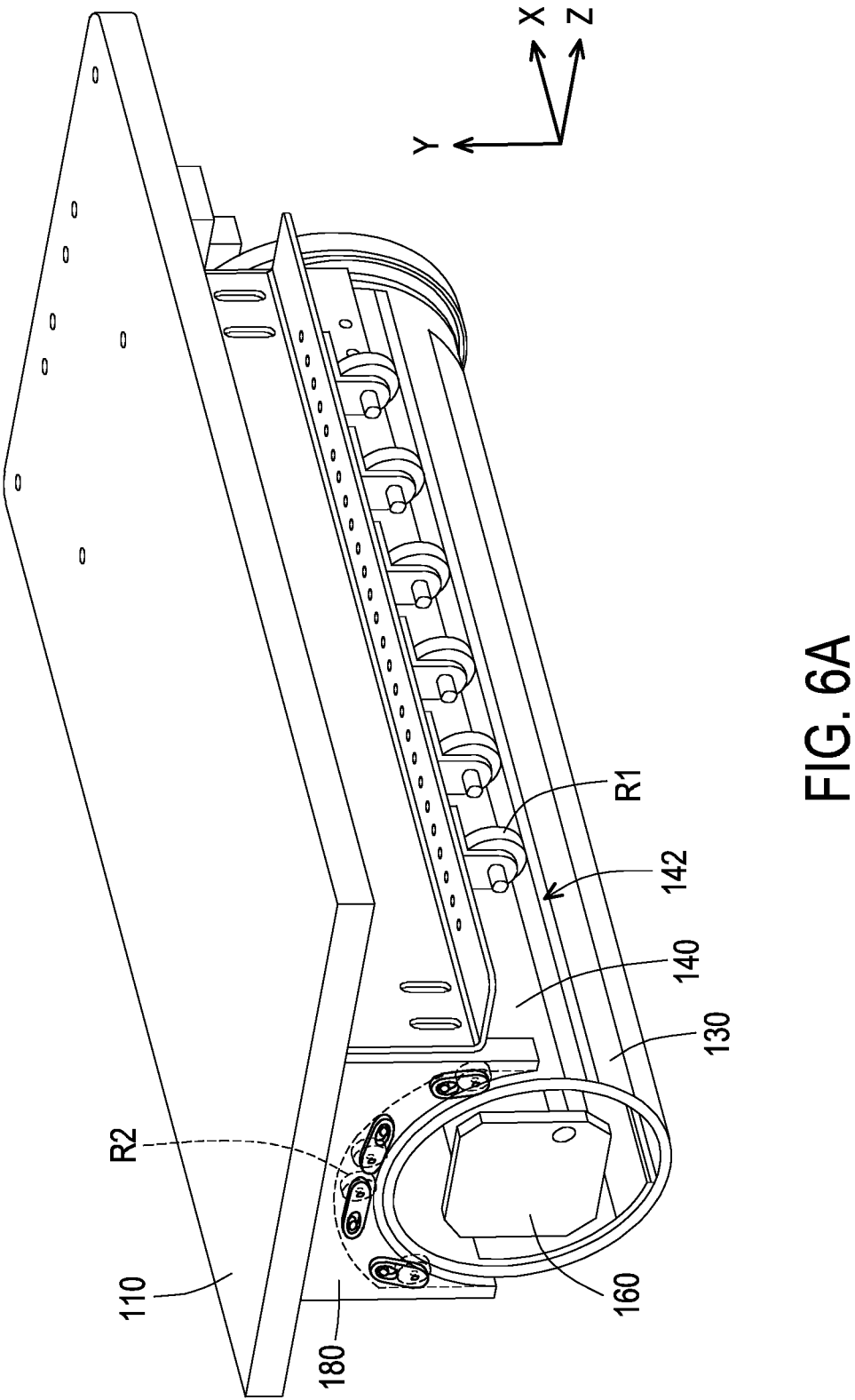
FIG. 6A is a schematic three-dimensional cross-sectional view of the display device in FIG. 4A.
Figure 6B:
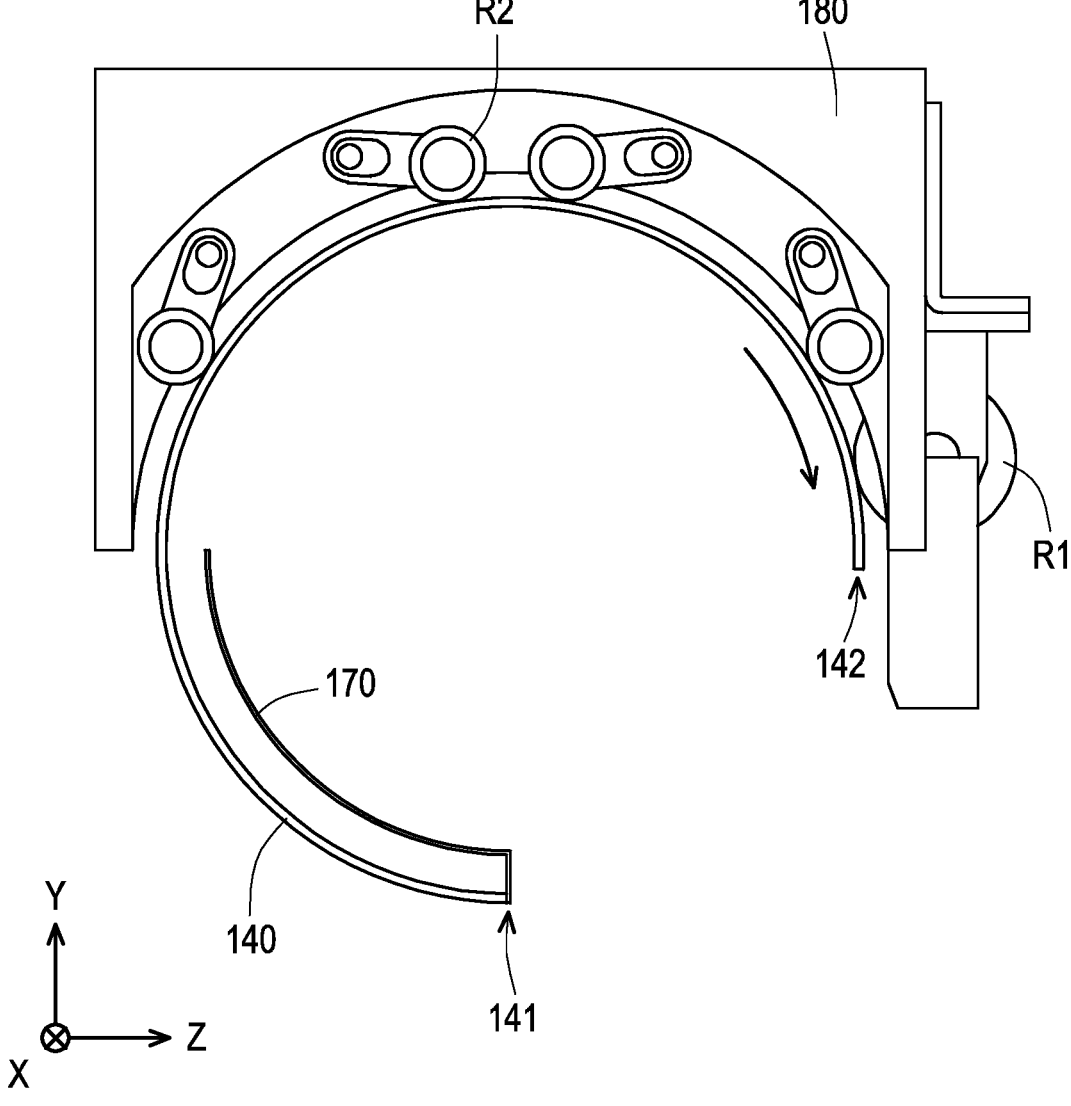
FIG. 6B is a schematic side view of the display device in FIG. 6A.
Figure 7:
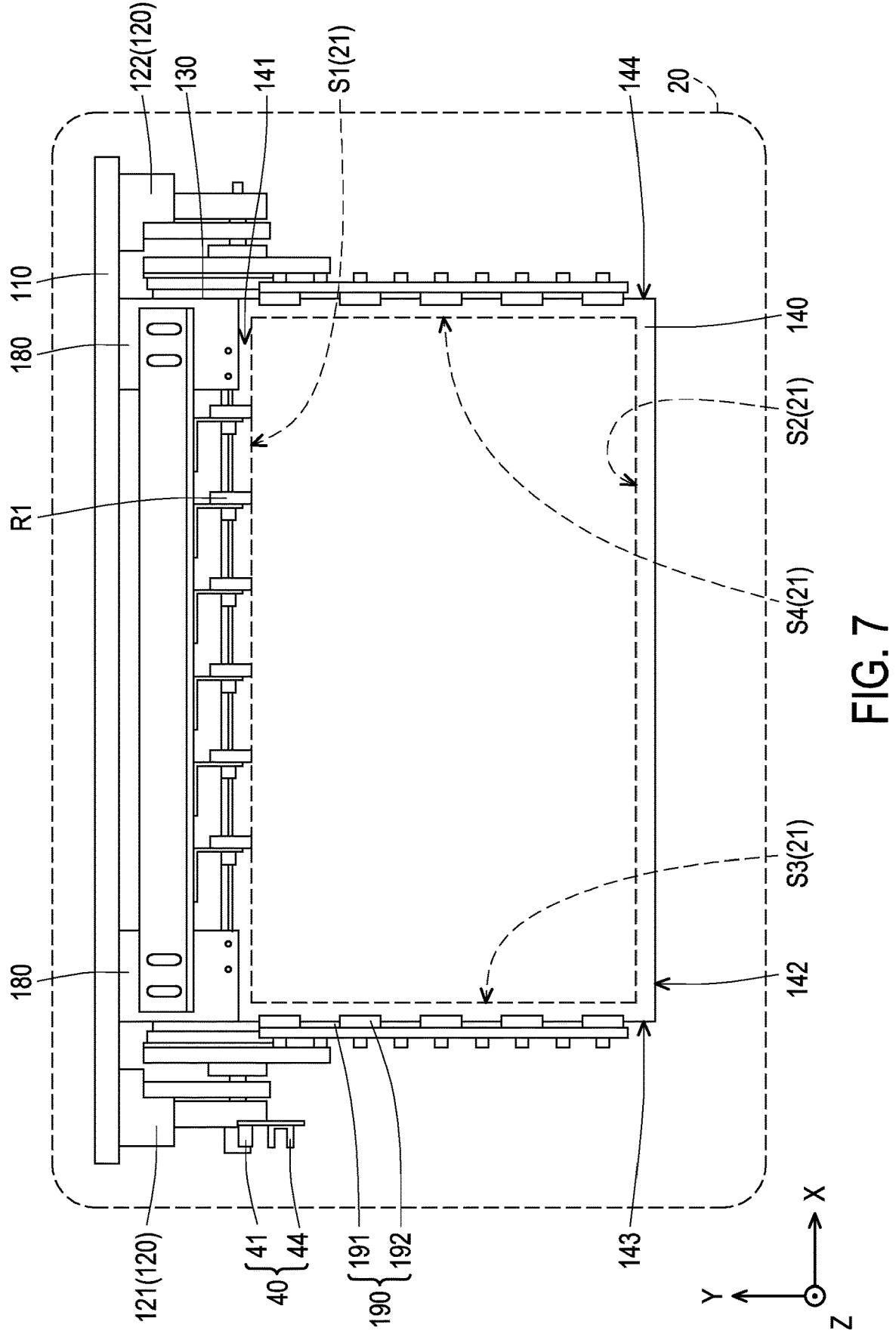
FIG. 7 is a schematic front view of the display device in FIG. 2.

FIG. 6A is a schematic three-dimensional cross-sectional view of the display device in FIG. 4A. FIG. 6B is a schematic side view of the display device in FIG. 6A. FIG. 7 is a schematic front view of the display device in FIG. 2. A Cartesian coordinate system X-Y-Z is provided herein for the convenience of subsequent descriptions and references to components. Note that the illustration of the appearance member is omitted in FIG. 6A, and the illustration of some structural parts omitted in FIG. 6B for the sake of clarity and identification of the components to be described.

With reference to FIG. 6A, FIG. 6B, and FIG. 7, in this embodiment, the display device 100 further includes a plurality of rolling members R1 arranged on the base 110 and aligned along the first side S1 of the opening 21. During the transition between the folded state and the unfolded state, the flexible screen 140 rotates clockwise, and the second edge 142 is adapted to pass through and contact the rolling members R1, so that the flexible screen 140 is closely adhered to the roller 130, which may prevent the flexible screen 140 from wrinkling while flexible screen 140 is being rolled up. Here, the rolling members R1 are rolling wheels, which should however not be construed as a limitation.

In this embodiment, the display device 100 further includes two limiting stands 180 arranged on the base 110 and located between the first bracket 121 and the second bracket 122. The two limiting stands 180 are adjacent to the two opposite ends of the roller 130, and each of the two limiting stands 180 includes a plurality of rolling wheels R2. In this embodiment, the contact between the rolling wheels R2 and the limiting stands 180 is a point contact with low friction, and the resultant sliding process is smooth.

In this embodiment, the flexible screen 140 has a third edge 143 and a fourth edge 144 that are opposite each other. While the roller 130 is unfolding or rolling up the flexible screen 140, the third edge 143 and the fourth edge 144 of the flexible screen 140 contact the rolling wheels R2, so that the flexible screen 140 is closely adhered to the roller 130, which may prevent the flexible screen 140 from wrinkling while the flexible screen 140 is being rolled up.

With reference to FIG. 7, in this embodiment, the rolling members R1 and the rolling wheels R2 are covered by the appearance member 20, ensuring they remain out of sight from the user's perspective, and such a design choice serves to preserve the overall visual aesthetics.

Figure 8:
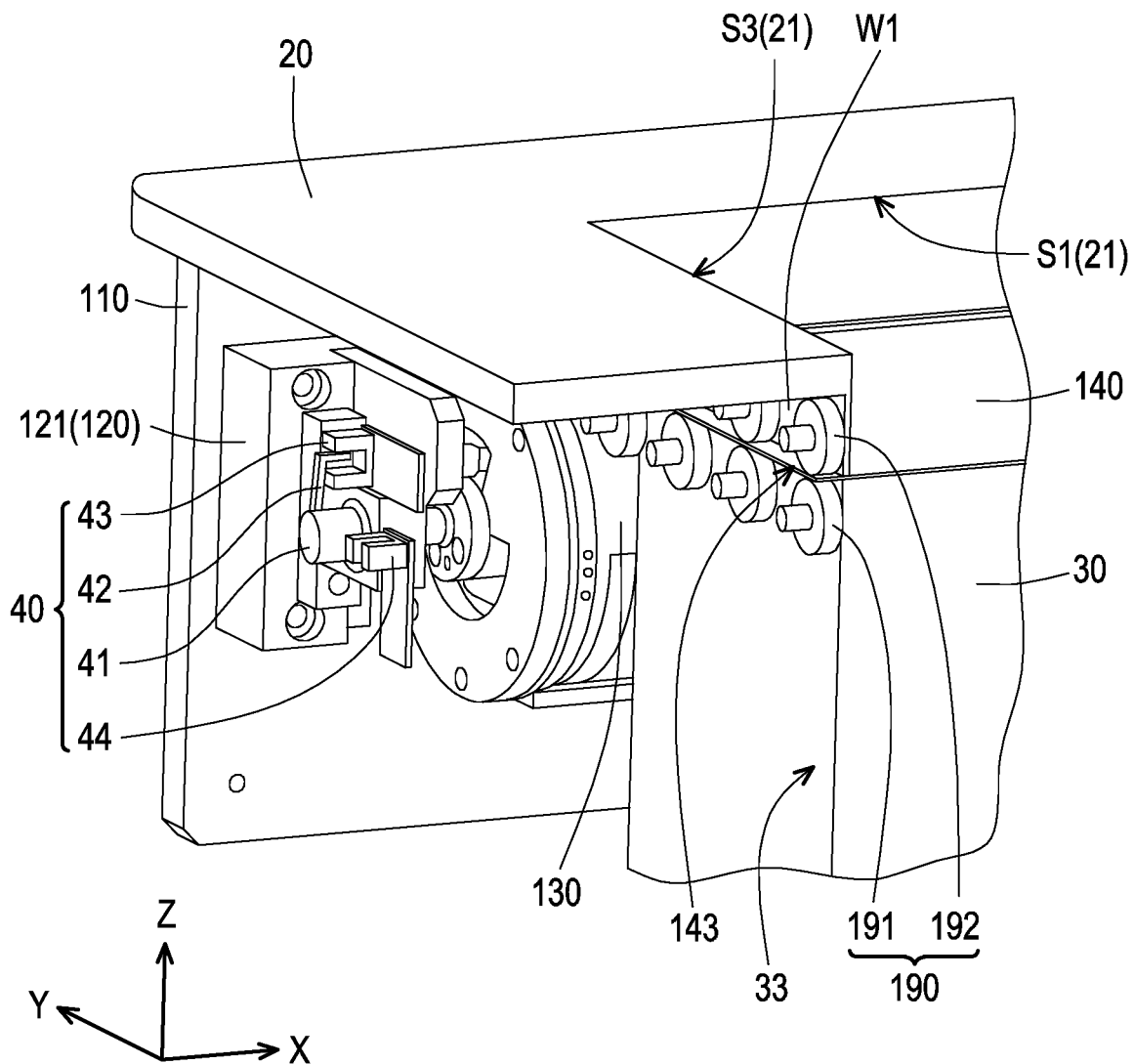
FIG. 8 is a schematic three-dimensional cross-sectional view of the display device in FIG. 2.

FIG. 8 is a schematic three-dimensional cross-sectional view of the display device in FIG. 2. With reference to FIG. 2 and FIG. 8, in this embodiment, the display device 100 further includes a support member 30 located below the appearance member 20 and corresponding to the opening 21. The support member 30 has a support plane that faces the opening 21 and is configured to support the back of the flexible screen 140. Here, the support member 30 may serve as a skeleton, a rib, and any other support component inside the headrest 51 in FIG. 1, which should however not be construed as a limitation in the disclosure.

In the folded state shown in FIG. 4A, the support member 30 is exposed to the opening 21. In the unfolded state shown in FIG. 4B and FIG. 8, the flexible screen 140 covers the support member 30, and the support member 30 is arranged to press the flexible screen 140 against the periphery of the appearance member 20 corresponding to the opening 21. When the flexible screen 140 is in the unfolded state as shown in FIG. 7, the user may perform a touch-sensing operation on the flexible screen 140, and the support member 30 is configured to maintain the rigidity of the flexible screen 140.

With reference to FIG. 2, FIG. 7, and FIG. 8, in this embodiment, the display device 100 further includes an auxiliary structure 190 that includes a plurality of first rotation members 191 and a plurality of second rotation members 192. The opening 21 has a third side S3 and a fourth side S4 opposite to each other. The first rotation members 191 are arranged on the opposite sides 33 and 34 of the support member 30, and the two opposite sides 33 and 34 of the support member 30 correspond to the third side S3 and the fourth side S4 of the opening 21, respectively. The second rotation members 192 are arranged on two opposite sidewalls W1 of the appearance member 20, and the two opposite sidewalls W1 correspond to the third side S3 and the fourth side S4 of the opening 21, respectively.

In this embodiment, the flexible screen 140 is adapted to pass through the auxiliary structure 190, and the third edge 143 and the fourth edge 144 are located between the first rotation members 191 and the second rotation members 192, which may prevent wrinkles from being generated while the flexible screen 140 is being rolled up. Here, the first rotation members 191 and the second rotation members 192 are rolling wheels, which should however not be construed as a limitation.

In this embodiment, in a normal direction (e.g., a Z direction) of the support plane facing the opening 21 of the support member 30, the first rotation members 191 and the second rotation members 192 are aligned with each other. In other embodiments, the first rotation members 191 and the second rotation members 192 are staggered, which should however not be construed as a limitation.

It should be noted that reference numbers of the elements and a part of contents of the previous embodiments are also used in the following embodiments, where the same reference numbers denote the same or like elements, and descriptions of the same technical contents are omitted. The previous embodiments may be referred for descriptions of the omitted parts, and detailed descriptions thereof are not repeated in the following embodiments.

Figure 9:
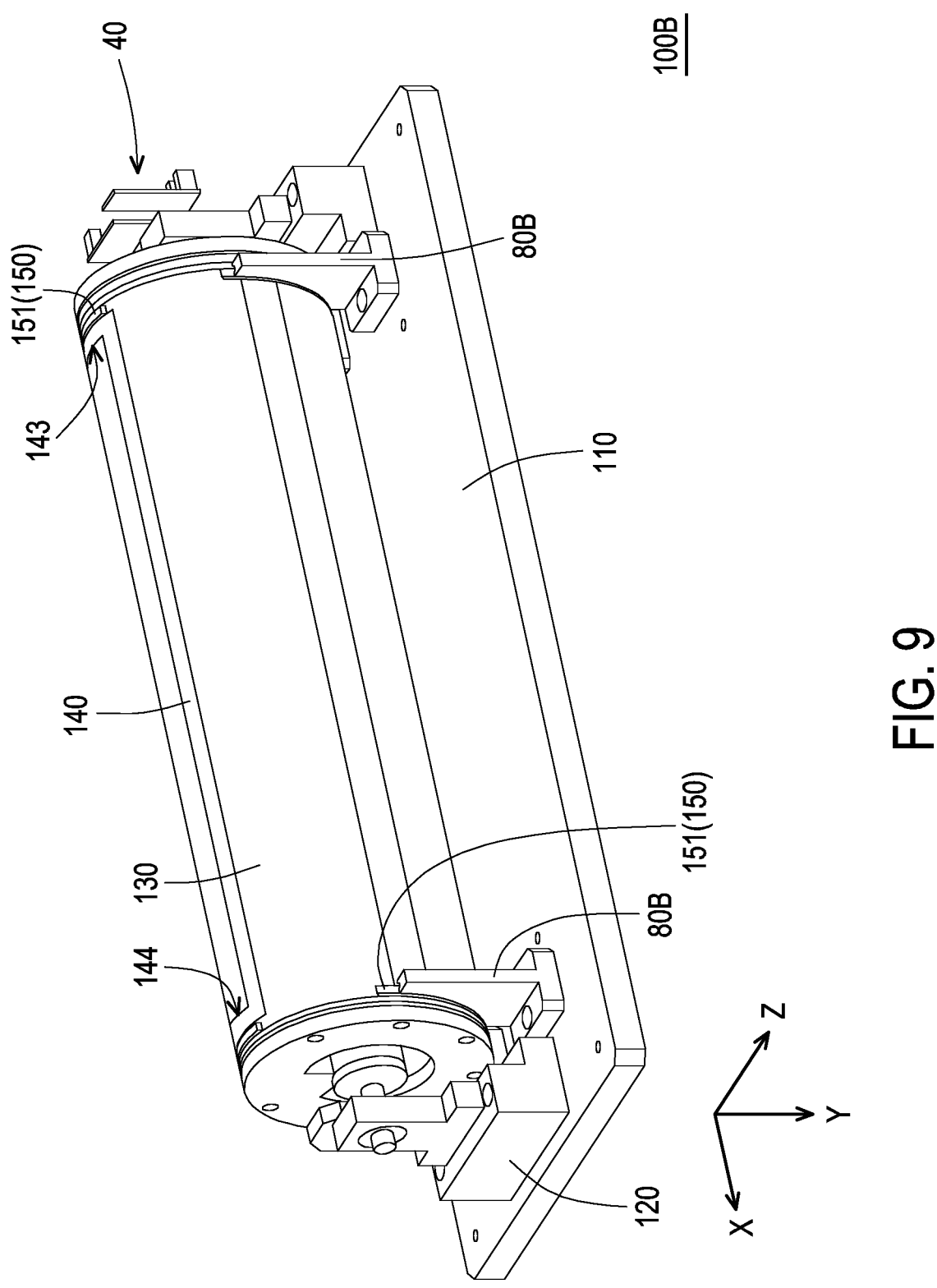
FIG. 9 is a schematic view of a display device according to another embodiment of the disclosure.
Figure 10:
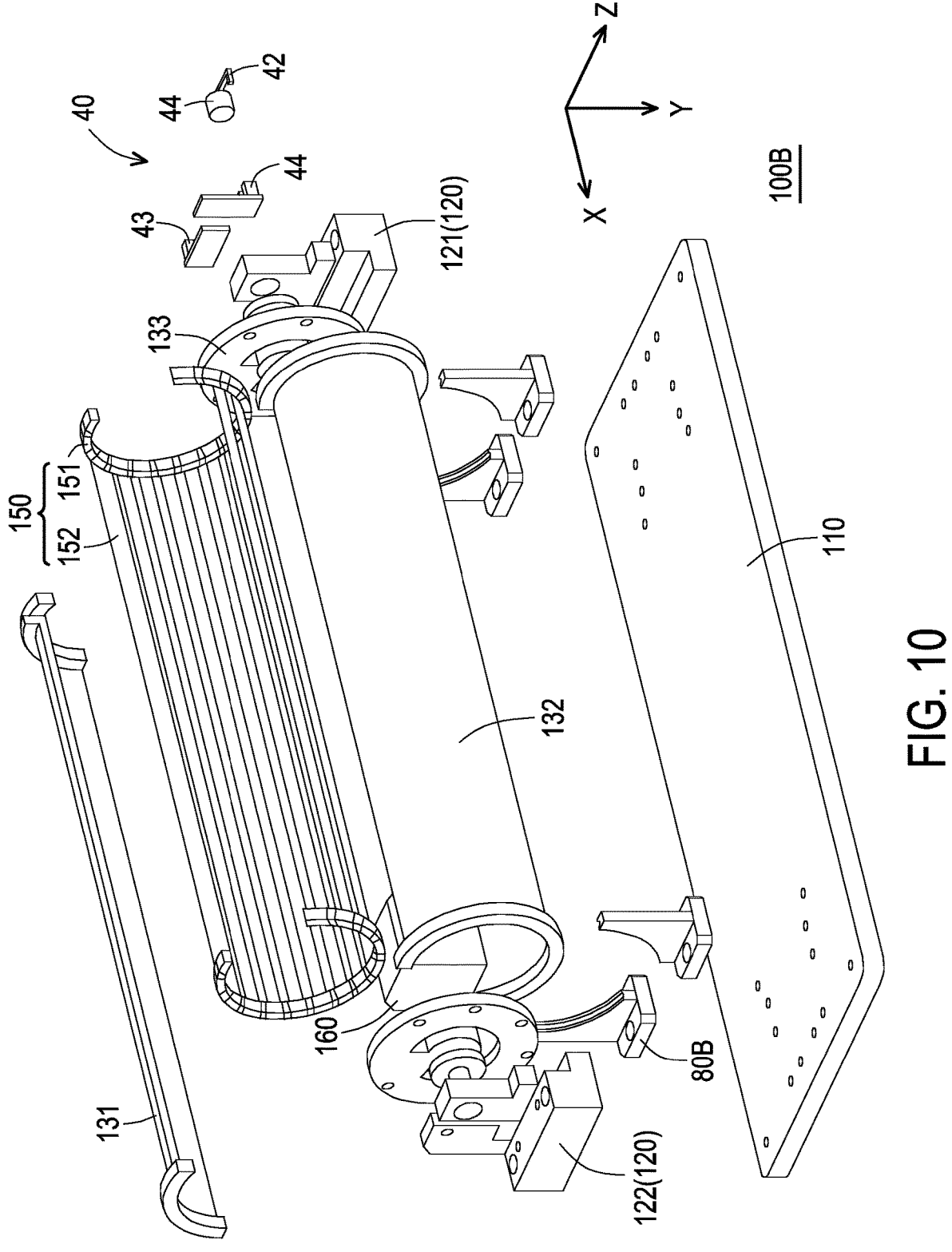
FIG. 10 is a schematic exploded view illustrating the display device in FIG. 9.

FIG. 9 is a schematic view of a display device according to another embodiment of the disclosure. FIG. 10 is a schematic exploded view illustrating the display device in FIG. 9. A Cartesian coordinate system X-Y-Z is provided for the convenience of subsequent descriptions and references to components. Note that the illustration of the appearance member is omitted in FIG. 9 and FIG. 10, and the illustration of the flexible screen is omitted in FIG. 10. Chains in these figures are schematically depicted, and the detailed structure of the chains is to be explained in the subsequent figures.

With reference to FIG. 9 and FIG. 10, in this embodiment, a display device 100B is slightly different from the display device 100 in FIG. 2, and the main difference lies in that the display device 100B further includes a support component 150 which includes two chains 151 and a plurality of support plates 152. The two chains 151 are respectively fixed to the third edge 143 and the fourth edge 144 of the flexible screen 140. Two opposite ends of each of the support plates 152 are connected to the two chains 151. Since the flexible screen 140 is lower than the surface of the headrest (i.e., the appearance member 20), the chains 151 are not exposed and thus not visible to the user, and such a design choice serves to preserve the overall visual aesthetics.

Specifically, in this embodiment, the limiting stands 180 in FIG. 6A are omitted in the display device 100B, and the display device 100B includes a plurality of limiting structures 80B arranged on the base 110 and located between the first bracket 121 and the second bracket 122. Here, the number of the limiting structures 80B shown in the figure is four, and the limiting structures 80B are arranged in pairs, which should however not be construed as a limitation.

Figure 11:
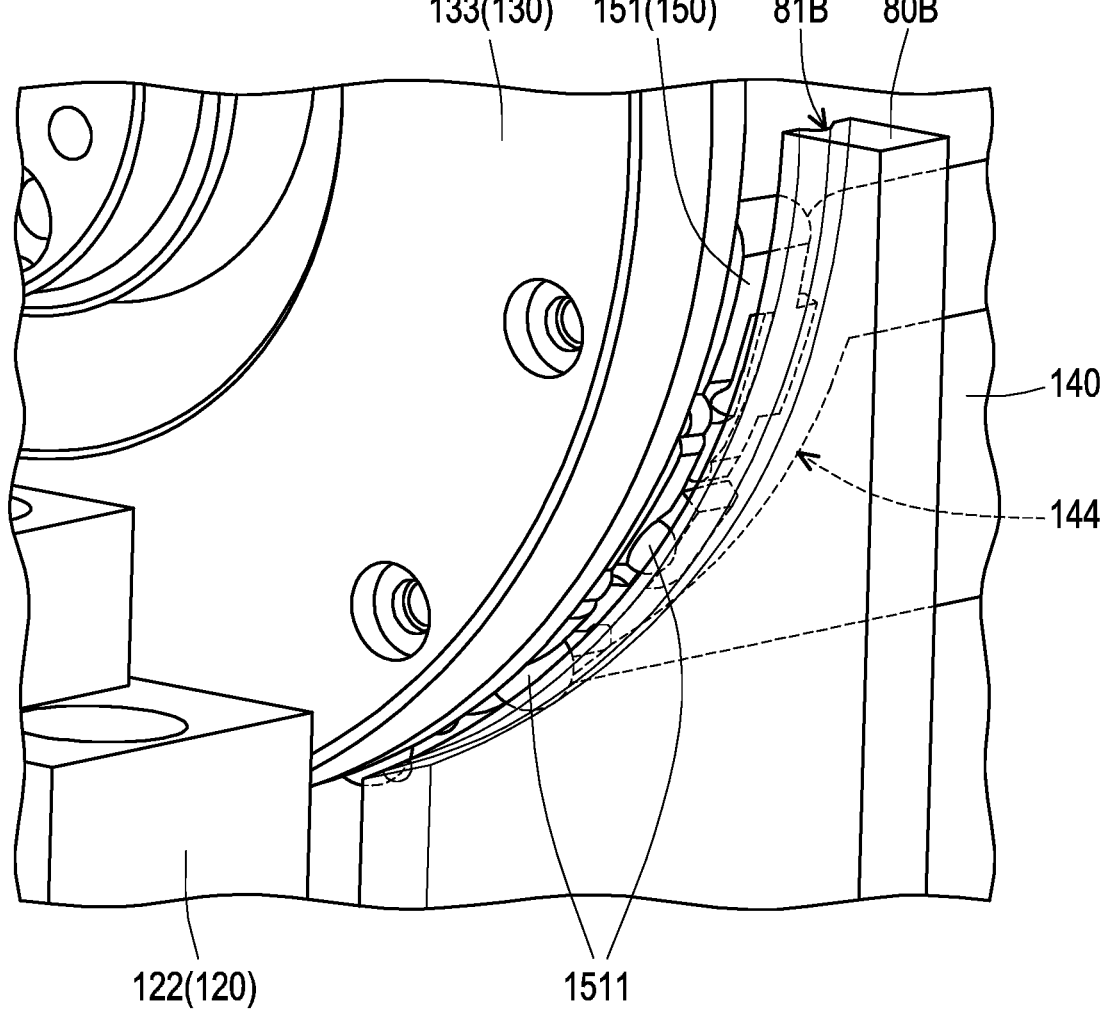
FIG. 11 is a schematic partial perspective view of the display device in FIG. 9.
Figure 12:
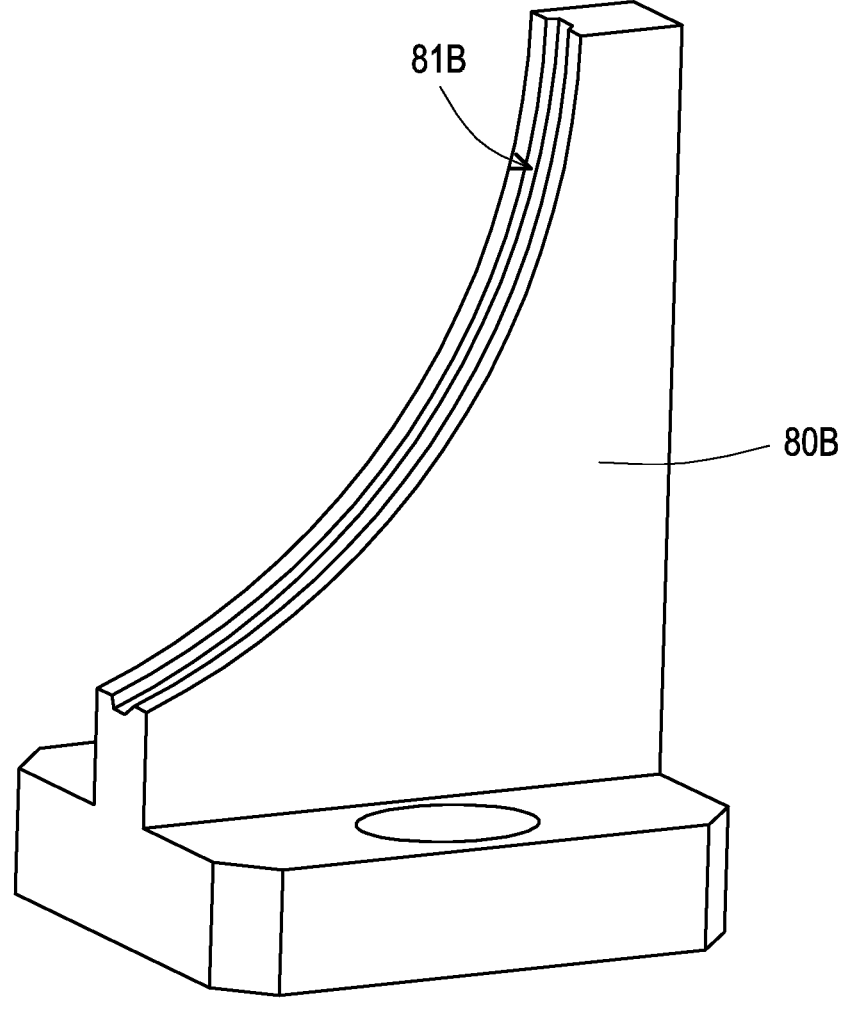
FIG. 12 is a schematic three-dimensional view of the limiting structure in FIG. 10.

FIG. 11 is a schematic partial perspective view of the display device in FIG. 9. FIG. 12 is a schematic three-dimensional view of the limiting structure in FIG. 10. With reference to FIG. 11 and FIG. 12, in this embodiment, each of the limiting structures 80B has a groove 81B, and each of the chains 151 includes a plurality of roller balls 1511 corresponding to the third edge 143 and the fourth edge 144, respectively. During the transition between the folded state and the unfolded state, the roller balls 1511 slide in the corresponding grooves 81B, allowing the flexible screen 140 to be closely adhered to the roller 130. In this embodiment, the contact between the roller balls 1511 and the grooves 81B refers to a point contact, resulting in low friction and smooth sliding.

Figure 13:
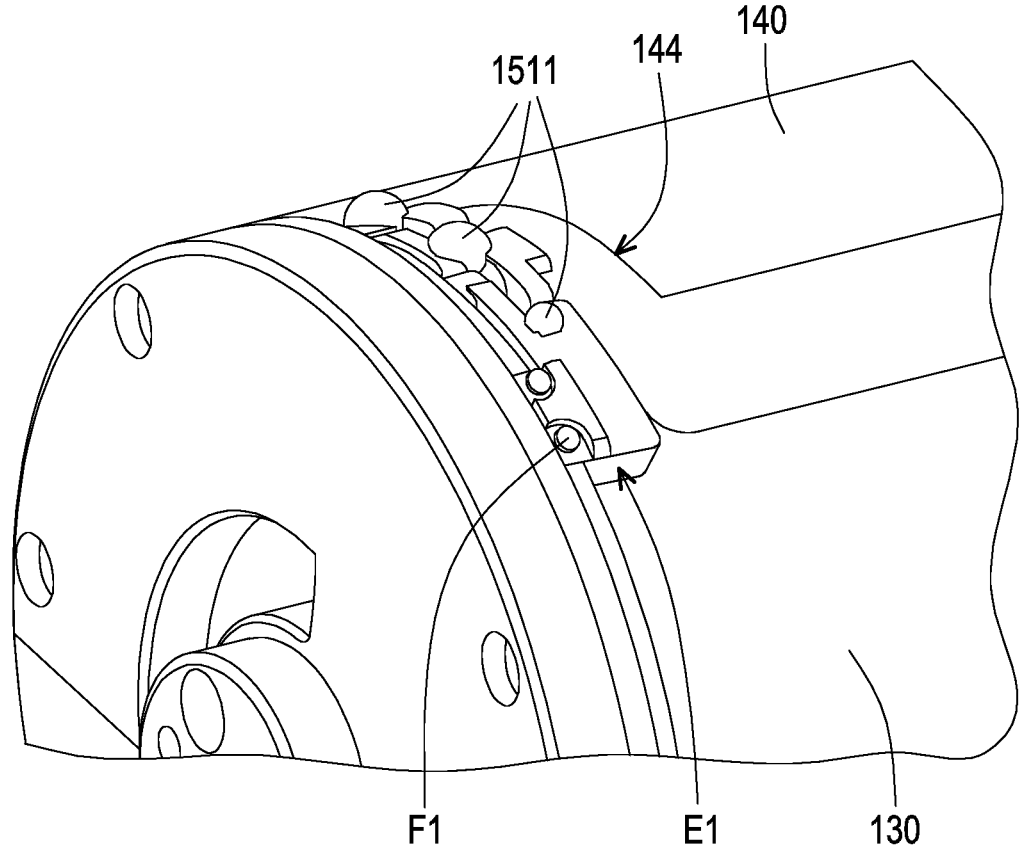
FIG. 13 is a schematic partial enlarged view of the display device in FIG. 10.
Figure 14:
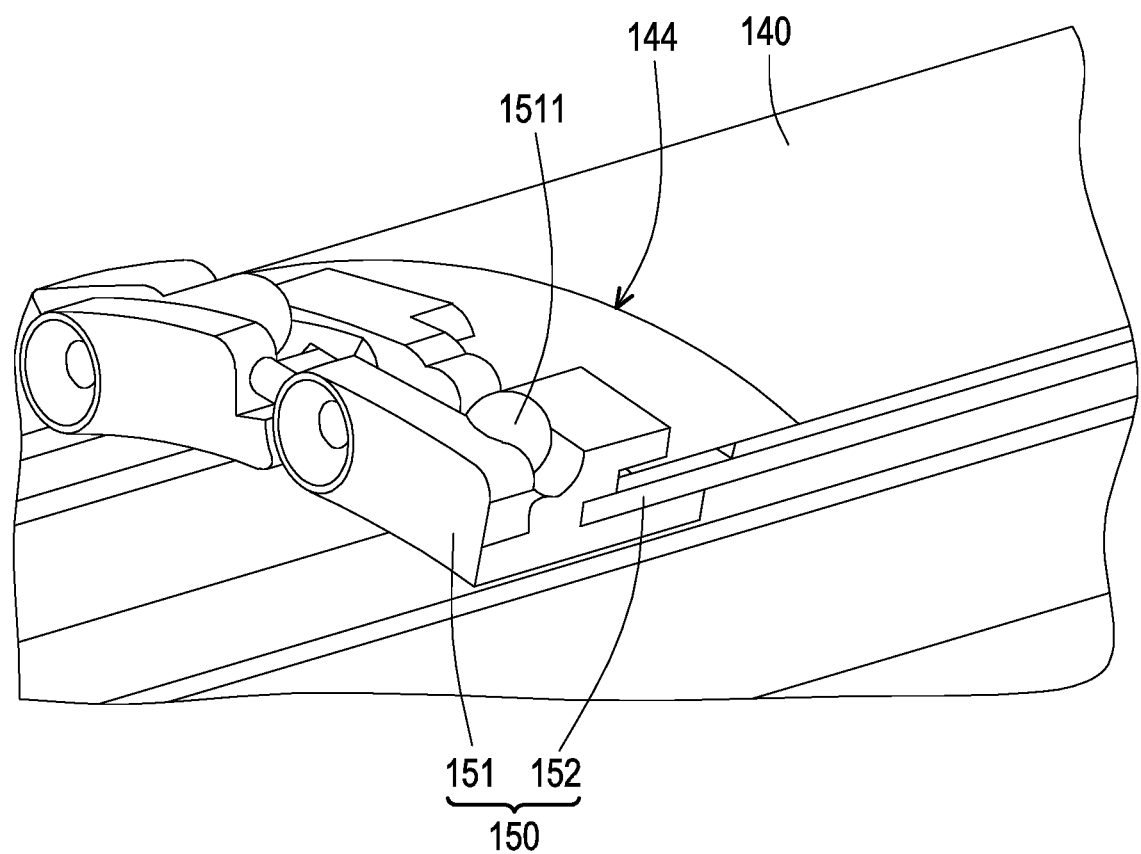
FIG. 14 is a cross-sectional view of the display device in FIG. 13.

FIG. 13 is a schematic partial enlarged view of the display device in FIG. 10. FIG. 14 is a cross-sectional view of the display device in FIG. 13. With reference to FIG. 13, in this embodiment, each of the chains 151 has an end portion E1 corresponding to the first edge 141, and the end portion E1 is fixed to the roller 130 by a fixing member F1, such as a screw. With reference to FIG. 14, in this embodiment, the support plate 152 is located below the flexible screen 140.

Figure 15A:
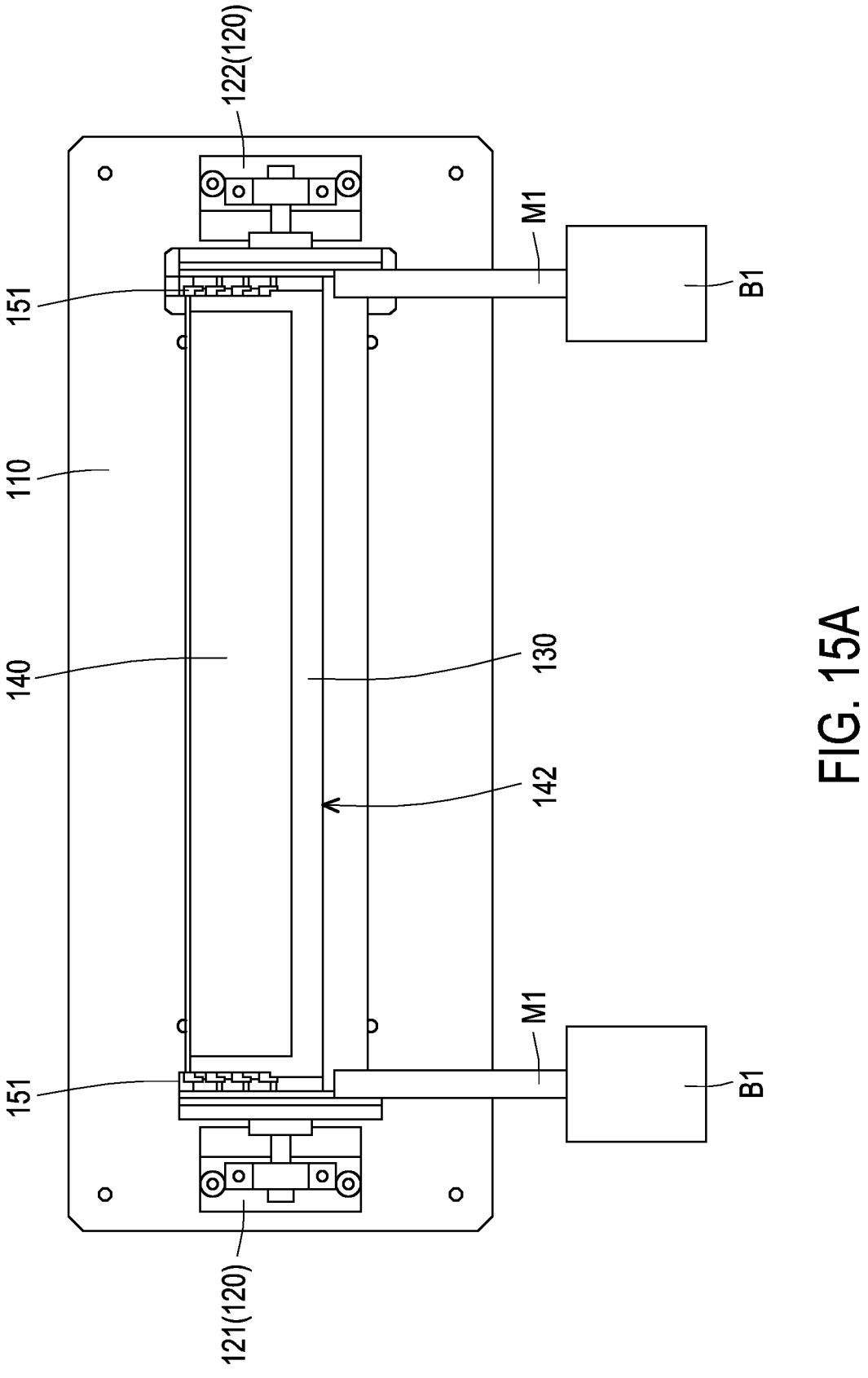
FIG. 15A is a schematic front view of the display device in FIG. 13.
Figure 15B:
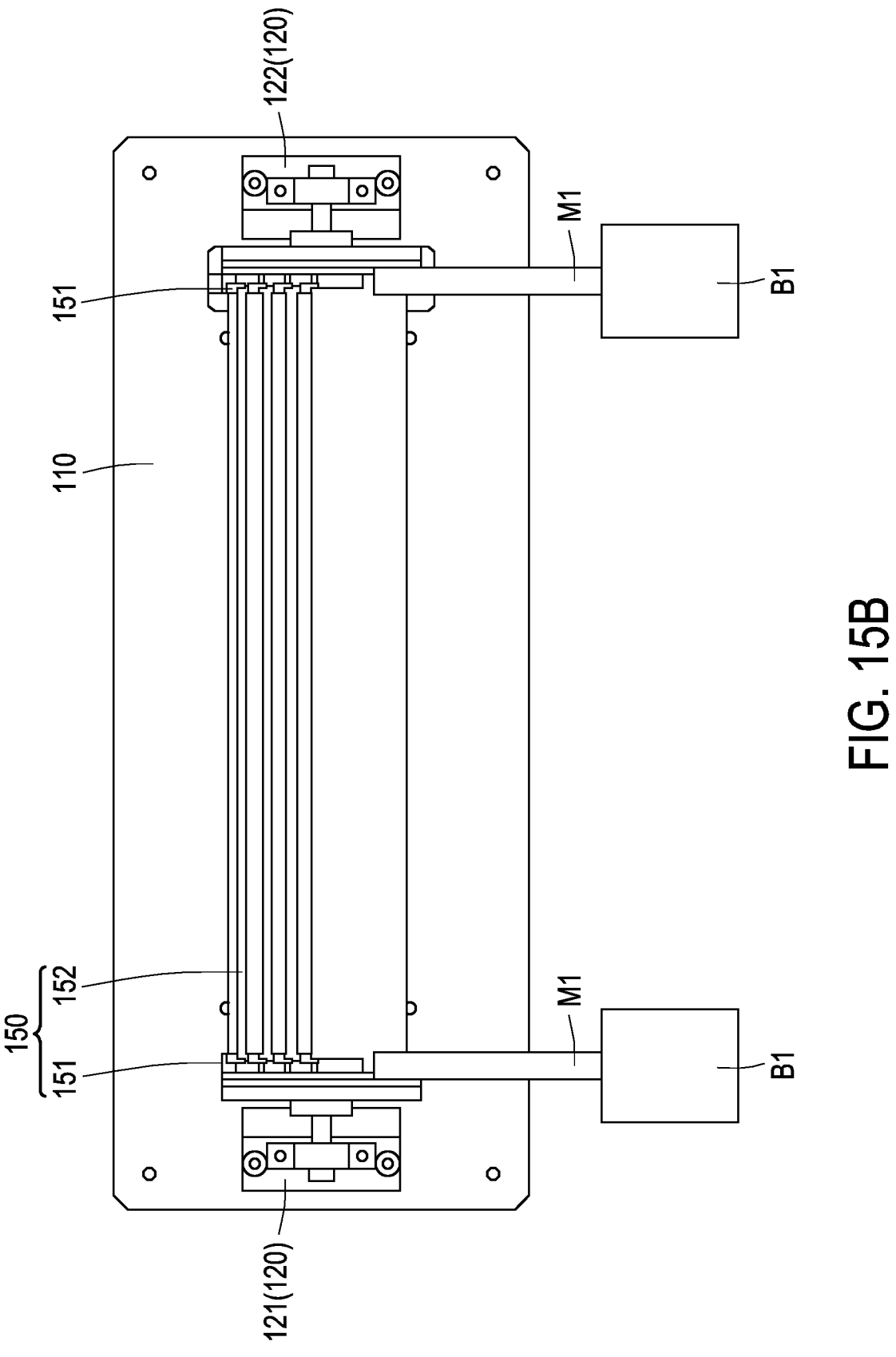
FIG. 15B and FIG. 15C are schematic views illustrating operations of the display device in FIG. 15A.
Figure 15C:
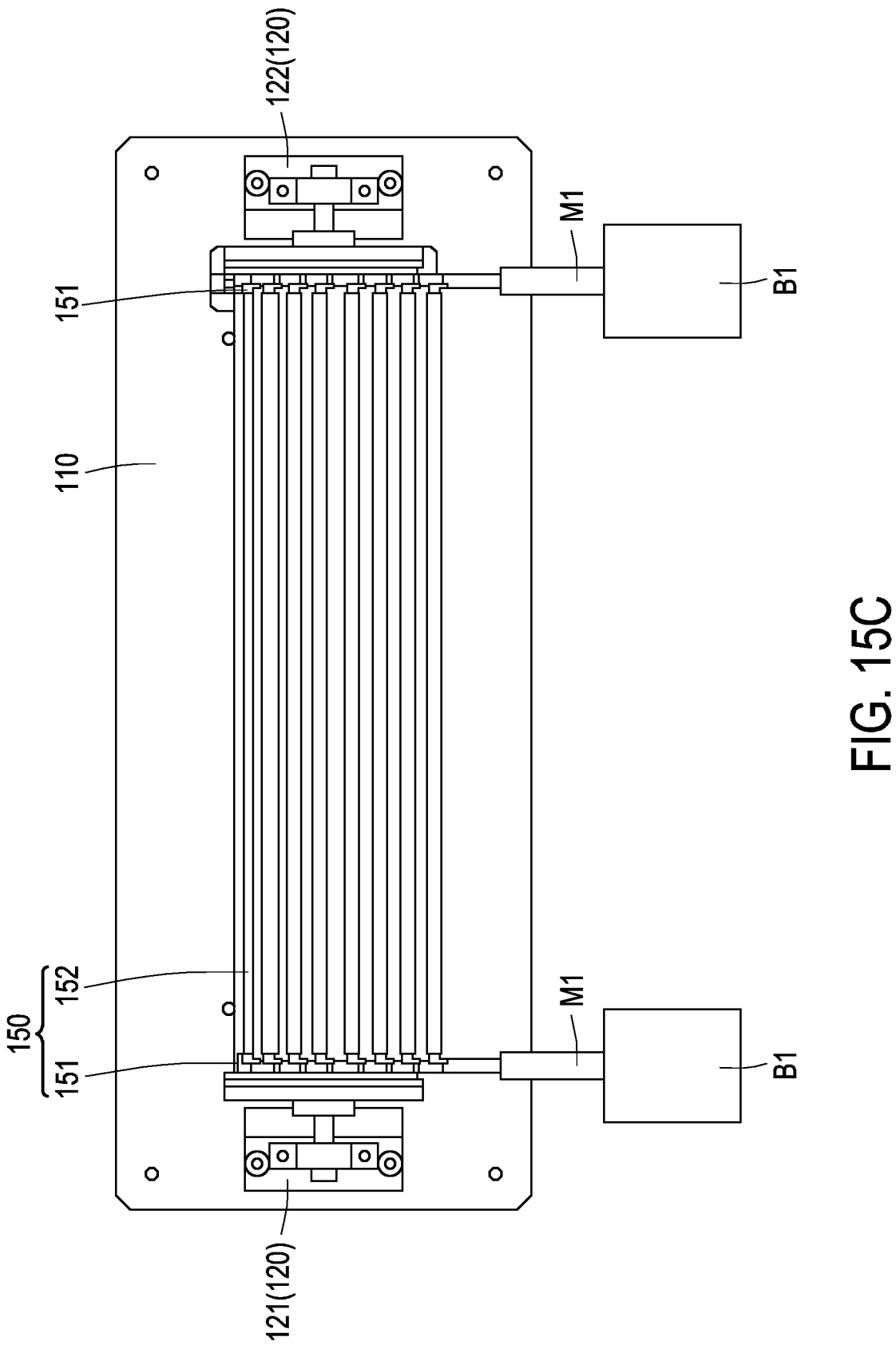

FIG. 15A is a schematic front view of the display device in FIG. 13. FIG. 15B and FIG. 15C are schematic views illustrating operations of the display device in FIG. 15A. With reference to FIG. 15A, in this embodiment, the display device 100B includes the driving member 160 and two magnetic members M1. The flexible screen 140 is moved by the driving member 160 and the magnetic members M1, which should however not be construed as a limitation in the disclosure.

In this embodiment, the two magnetic members M1 correspond to the two chains 151. Here, the magnetic members M1 are electromagnetic rods, and the chains 151 are metal chains. The two magnetic members M1 are adapted for magnetically attracting two chains 151 to drive the support plate 152 to move, thereby driving the second edge 142 of the flexible screen 140 to move towards the second side S2 (FIG. 7) of the opening 21 (FIG. 7). The magnetic member M1 is adapted to be covered by the appearance member 20 or embedded in the seat 50, which should however not be construed as a limitation in the disclosure.

Specifically, when powered, the magnetic members M1 extend outwards from bases B1, exhibiting high voltage and strong suction capabilities. When the magnetic members M1 are prompted in an upward motion, the magnetic members M1 exert an attractive force on the chains 151 to push the flexible screen 140 upwards and enable the flexible screen 140 to roll around the roller 130. Following the attraction, the voltage may be diminished to sustain the attachment; by contrast, in the absence of power, the magnetic members M1 retract into the bases B1. When the magnetic members M1 descend, the magnetic members M1 still maintain the suction strength and exert a force that draws the flexible screen 140 to unfold. This operation leverages the principles of electromagnetism for extension and storage. Throughout this operation process, the support plate 152 experiences a greater force, while the flexible screen 140 encounters less force, contributing to enhanced operational smoothness.

To sum up, in the display device provided in one or more embodiments of the disclosure, the roller is adapted to unfold or roll up the flexible screen, and the size of the display frame on the flexible screen may be adjusted according to the usage scenario, which contributes to the reduction of power consumption. Besides, during instances of abrupt braking or collisions of vehicles, the flexible screen may be changed to the folded state, allowing the flexible screen to be stored behind the appearance member, so as to avoid passengers from hitting the flexible screen and accordingly prevent the resultant shattered glass fragments from causing cuts to the passengers.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:

a base;

a pivot assembly, arranged on the base;

a roller, having two opposite ends pivotally connected to the pivot assembly;

a flexible screen, having a first edge and a second edge opposite to each other, wherein the first edge is connected to the roller, and the roller is adapted to unfold or roll up the flexible screen; and an appearance member, having an opening, the opening having a first side and a second side opposite to each other, the appearance member covering the base, the base corresponding to the first side, wherein in a folded state, the flexible screen is located outside the opening, during a transition from the folded state to an unfolded state, the second edge moves towards the second side of the opening to expose at least one portion of the flexible screen to the opening, wherein the display device further comprises a support member located below the appearance member and corresponding to the opening, wherein in the unfolded state, the flexible screen covers the support member, and the support member is configured to press the flexible screen against a periphery of the appearance member corresponding to the opening.

2. The display device according to claim 1, further comprising a driving member arranged in the roller and adapted to drive the roller to rotate relative to the base.

3. The display device according to claim 1, wherein the roller comprises a first shell and a second shell, a connection point where the first shell is assembled to the second shell has a notch, and the first edge of the flexible screen corresponds to the notch.

4. The display device according to claim 3, further comprising a circuit board, wherein one end of the circuit board is connected to the first edge, and the circuit board extends into the roller through the notch to be adhered to an inner surface of the second shell.

5. The display device according to claim 1, further comprising an auxiliary structure comprising a plurality of first rotation members and a plurality of second rotation members, wherein the opening has a third side and a fourth side opposite to each other, the first rotation members are arranged on two opposite sides of the support member, the second rotation members are arranged on two opposite sidewalls of the appearance member, the flexible screen has a third edge and a fourth edge opposite to each other, the flexible screen is adapted to pass through the auxiliary structure, and the third edge and fourth edge are located between the first rotation members and the second rotation members.

6. The display device according to claim 5, wherein in a normal direction of the support member, the first rotation members and the second rotation members are staggered or aligned with each other.

7. The display device according to claim 1, further comprising a plurality of rolling members arranged on the first side of the opening, wherein during the transition between the folded state and the unfolded state, the second edge of the flexible screen is adapted to pass through and contact the rolling members.

8. The display device according to claim 1, wherein the pivot assembly comprises a first bracket and a second bracket, and the two opposite ends of the roller are pivotally connected to the first bracket and the second bracket, respectively.

9. The display device according to claim 8, further comprising two limiting stands arranged on the base and located between the first bracket and the second bracket, wherein each of the two limiting stands comprises a plurality of rolling wheels, the flexible screen has a third edge and a fourth edge opposite to each other, and while the roller is unfolding or rolling up the flexible screen, the third edge and the fourth edge of the flexible screen contact the rolling wheels.

10. The display device according to claim 8, further comprising an optical sensor module arranged on the first bracket.

11. The display device according to claim 1, further comprising a support component comprising two chains and a plurality of support plates, wherein the flexible screen has a third edge and a fourth edge opposite to each other, the two chains are respectively fixed to the third edge and the fourth edge, each of the chains has an end portion corresponding to the first edge, the end portion is fixed to the roller, two opposite ends of each of the support plates are connected to the two chains, and the support plates are located below the flexible screen.

12. The display device according to claim 11, further comprising a plurality of limiting structures arranged on the base, wherein each of the limiting structures has a groove, each of the chains comprises a plurality of roller balls corresponding to the third edge and the fourth edge, respectively, and during the transition from the folded state to the unfolded state, the roller balls are adapted to contact the grooves respectively corresponding to the roller balls.

13. The display device according to claim 12, further comprising two magnetic members corresponding to the two chains, wherein the two magnetic members are adapted to magnetically attract the two chains to drive the support plates to move and further drive the second edge of the flexible screen to move towards the second side of the opening.

14. A display device, comprising:

a base;

a pivot assembly, arranged on the base;

a roller, having two opposite ends pivotally connected to the pivot assembly;

a flexible screen, having a first edge and a second edge opposite to each other, wherein the first edge is connected to the roller, and the roller is adapted to unfold or roll up the flexible screen; and an appearance member, having an opening, the opening having a first side and a second side opposite to each other, the appearance member covering the base, the base corresponding to the first side, wherein in a folded state, the flexible screen is located outside the opening, during a transition from the folded state to an unfolded state, the second edge moves towards the second side of the opening to expose at least one portion of the flexible screen to the opening, wherein the display device further comprises an auxiliary structure comprising a plurality of first rotation members and a plurality of second rotation members, the flexible screen has a third edge and a fourth edge opposite to each other, the flexible screen is adapted to pass through the auxiliary structure, and the third edge and the fourth edge are located between the first rotation members and the second rotation members.

15. A display device, comprising:

a base;

a pivot assembly, arranged on the base;

a roller, having two opposite ends pivotally connected to the pivot assembly;

a flexible screen, having a first edge and a second edge opposite to each other, wherein the first edge is connected to the roller, and the roller is adapted to unfold or roll up the flexible screen; and an appearance member, having an opening, the opening having a first side and a second side opposite to each other, the appearance member covering the base, the base corresponding to the first side, wherein in a folded state, the flexible screen is located outside the opening, during a transition from the folded state to an unfolded state, the second edge moves towards the second side of the opening to expose at least one portion of the flexible screen to the opening, wherein the pivot assembly comprises a first bracket and a second bracket, and the two opposite ends of the roller are pivotally connected to the first bracket and the second bracket, respectively, wherein the display device further comprises two limiting stands arranged on the base and located between the first bracket and the second bracket, wherein each of the two limiting stands comprises a plurality of rolling wheels, the flexible screen has a third edge and a fourth edge opposite to each other, and while the roller is unfolding or rolling up the flexible screen, the third edge and the fourth edge of the flexible screen contact the rolling wheels.

\* \* \* \* \*